(12) United States Patent
Spierling

(10) Patent No.: US 8,855,952 B2
(45) Date of Patent: Oct. 7, 2014

(54) RAM AIR TURBINE WITH FLUX REGULATED PERMANENT MAGNET GENERATOR AND TESTING METHOD

(75) Inventor: Todd A. Spierling, Byron, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 601 days.

(21) Appl. No.: 12/984,759

(22) Filed: Jan. 5, 2011

(65) Prior Publication Data

US 2012/0173173 A1    Jul. 5, 2012

(51) Int. Cl.
| | |
|---|---|
| *G06F 19/00* | (2011.01) |
| *F01D 21/00* | (2006.01) |
| *F02C 7/32* | (2006.01) |
| *G01R 31/34* | (2006.01) |
| *F01D 15/10* | (2006.01) |
| *B64D 41/00* | (2006.01) |

(52) U.S. Cl.
CPC ............... *F01D 21/003* (2013.01); *F02C 7/32* (2013.01); *B64D 41/007* (2013.01); *G01R 31/346* (2013.01); *F01D 15/10* (2013.01)
USPC .......................................... 702/58; 702/184

(58) Field of Classification Search
USPC ........ 290/1 R, 44, 55, 90; 702/135, 136, 179, 702/181, 182, 183
See application file for complete search history.

(56) References Cited

U.S. PATENT DOCUMENTS

| | | | |
|---|---|---|---|
| 4,319,297 A * | 3/1982 | Lapsker | ........................... 361/23 |
| 4,403,292 A | 9/1983 | Ejzak et al. | |
| 4,410,851 A | 10/1983 | Goffaux | |
| 4,411,596 A | 10/1983 | Chilman | |
| 4,676,458 A | 6/1987 | Cohen | |
| 4,701,104 A | 10/1987 | Cohen | |
| 4,717,095 A | 1/1988 | Cohen et al. | |
| 4,729,102 A | 3/1988 | Miller, Jr. et al. | |
| 4,742,976 A | 5/1988 | Cohen | |
| 4,743,163 A | 5/1988 | Markunas et al. | |
| 4,991,796 A | 2/1991 | Peters et al. | |
| 5,068,591 A | 11/1991 | Hoeberg et al. | |
| 5,122,036 A | 6/1992 | Dickes et al. | |
| 5,174,719 A | 12/1992 | Walsh et al. | |
| 5,257,907 A | 11/1993 | Seidel | |
| 5,325,043 A | 6/1994 | Parro | |
| 5,386,363 A | 1/1995 | Haak et al. | |
| 5,398,780 A * | 3/1995 | Althof et al. | ..................... 185/39 |
| 5,444,349 A | 8/1995 | Rozman et al. | |
| 5,461,293 A | 10/1995 | Rozman et al. | |
| 5,484,120 A | 1/1996 | Blakeley et al. | |
| 5,495,162 A | 2/1996 | Rozman et al. | |

(Continued)

FOREIGN PATENT DOCUMENTS

| | | |
|---|---|---|
| GB | 2461057 A | 12/2009 |
| JP | S5876776 A | 5/1983 |
| WO | WO99/14116 A1 | 3/1999 |

OTHER PUBLICATIONS

Extended European Search Report from EP Application Serial No. 11194851.9, Dated Feb. 17, 2014, 7 pages.

*Primary Examiner* — John Breene
*Assistant Examiner* — Corey Bailey
(74) *Attorney, Agent, or Firm* — Kinney & Lange, P.A.

(57) ABSTRACT

A deployable ram air turbine assembly includes a rotatable turbine, a drivetrain mechanically connected to the rotatable turbine, and a flux regulated permanent magnet generator operably connected to the drivetrain.

20 Claims, 3 Drawing Sheets

(56) References Cited

U.S. PATENT DOCUMENTS

| | | |
|---|---|---|
| 5,508,633 A | 4/1996 | Rivera |
| 5,558,495 A | 9/1996 | Parker et al. |
| 5,562,417 A | 10/1996 | Grimm et al. |
| 5,746,580 A | 5/1998 | Parker et al. |
| 5,747,971 A | 5/1998 | Rozman et al. |
| 5,779,446 A | 7/1998 | Althof et al. |
| 5,820,074 A | 10/1998 | Trommer et al. |
| 5,899,411 A | 5/1999 | Latos et al. |
| 5,977,648 A * | 11/1999 | Seffernick et al. ............... 290/43 |
| 6,145,308 A | 11/2000 | Bueche et al. |
| 6,181,112 B1 | 1/2001 | Latos et al. |
| 6,504,730 B1 | 1/2003 | Cooney et al. |
| 6,794,883 B2 * | 9/2004 | Klingel ........................ 324/522 |
| 6,936,948 B2 * | 8/2005 | Bell et al. ....................... 310/201 |
| 6,965,183 B2 | 11/2005 | Dooley |
| 6,972,554 B1 * | 12/2005 | Davis ........................ 324/121 R |
| 7,042,110 B2 * | 5/2006 | Mikhail et al. .................. 290/44 |
| 7,119,548 B1 | 10/2006 | Cook et al. |
| 7,197,870 B2 | 4/2007 | Bannon |
| 7,416,392 B2 | 8/2008 | Russ |
| 7,439,713 B2 * | 10/2008 | Dooley .......................... 322/22 |
| 7,777,384 B2 | 8/2010 | Gieras et al. |
| 7,915,869 B2 * | 3/2011 | Xu et al. ......................... 322/59 |
| 8,269,449 B2 * | 9/2012 | Bjerknes et al. ............... 318/723 |
| 8,319,517 B2 * | 11/2012 | Elshaer .................... 324/765.01 |
| 2003/0178999 A1 * | 9/2003 | Klingel ........................ 324/522 |
| 2006/0267406 A1 | 11/2006 | Mehrer et al. |
| 2006/0273682 A1 * | 12/2006 | Kawamura ................... 310/191 |
| 2009/0256511 A1 | 10/2009 | Rozman et al. |
| 2010/0148622 A1 | 6/2010 | Dooley |
| 2011/0133485 A1 * | 6/2011 | Gieras et al. .................. 290/1 R |
| 2011/0140424 A1 * | 6/2011 | Edenfeld ......................... 290/44 |

\* cited by examiner

RAM AIR TURBINE WITH FLUX REGULATED PERMANENT MAGNET GENERATOR AND TESTING METHOD

BACKGROUND

The present invention relates to ram air turbines, and more particularly to ram air turbines having generators and methods for testing the same.

Deployable ram air turbines (RATs) are used on aircraft to provide an emergency power supply to power a generator, hydraulic pump, etc. When not in use, the RAT is generally stowed within the aircraft fuselage. When the aircraft is in flight, the RAT can be deployed to generate power as turbine blades of the RAT spin in oncoming airflow around the aircraft. The RAT can be deployed as a secondary or emergency system when power is unavailable from primary systems of the aircraft.

RATs must be periodically tested to ensure proper operation, particularly because RAT usage is generally infrequent. Conventional RATs use brushless wound-field synchronous generators to generate electrical power. With such wound-field generators, the RAT must be deployed to enable the generator to be rotated to perform testing. Testing is not possible when the RAT and its wound-field generator are stowed and at rest. Although it is particularly desirable to test components of the generator's rotor, wiring (i.e., windings) of the rotor of the wound-field generator are not accessible to an operator when the RAT is stowed and non-operational. In addition, wound field synchronous machines are very complex, typically with three electrical stages (main, exciter and PMG) and rotating rectifiers, with increased needs for reliability inspections.

SUMMARY

A deployable ram air turbine assembly according to the present invention includes a rotatable turbine, a drivetrain mechanically connected to the rotatable turbine, and a flux regulated permanent magnet generator operably connected to the drivetrain.

In another aspect of the present invention, a testing method includes providing power to a first winding of the flux regulated permanent magnet generator when a rotor of the flux regulated permanent magnet generator is at rest, sensing a resistance of the first winding or performing a dielectric test of electrical insulation adjacent to the first winding, to sense power leakage between the first winding and another electrical conductor or ground, analyzing the sensed resistance of the first winding or sensed data from the dielectric test, and sending an output indicative of test data gathered from the flux regulated permanent magnet generator to a central maintenance computer after analyzing the sensed resistance of the first winding or analyzing sensed data from the dielectric test.

DETAILED DESCRIPTION

Figure 1:
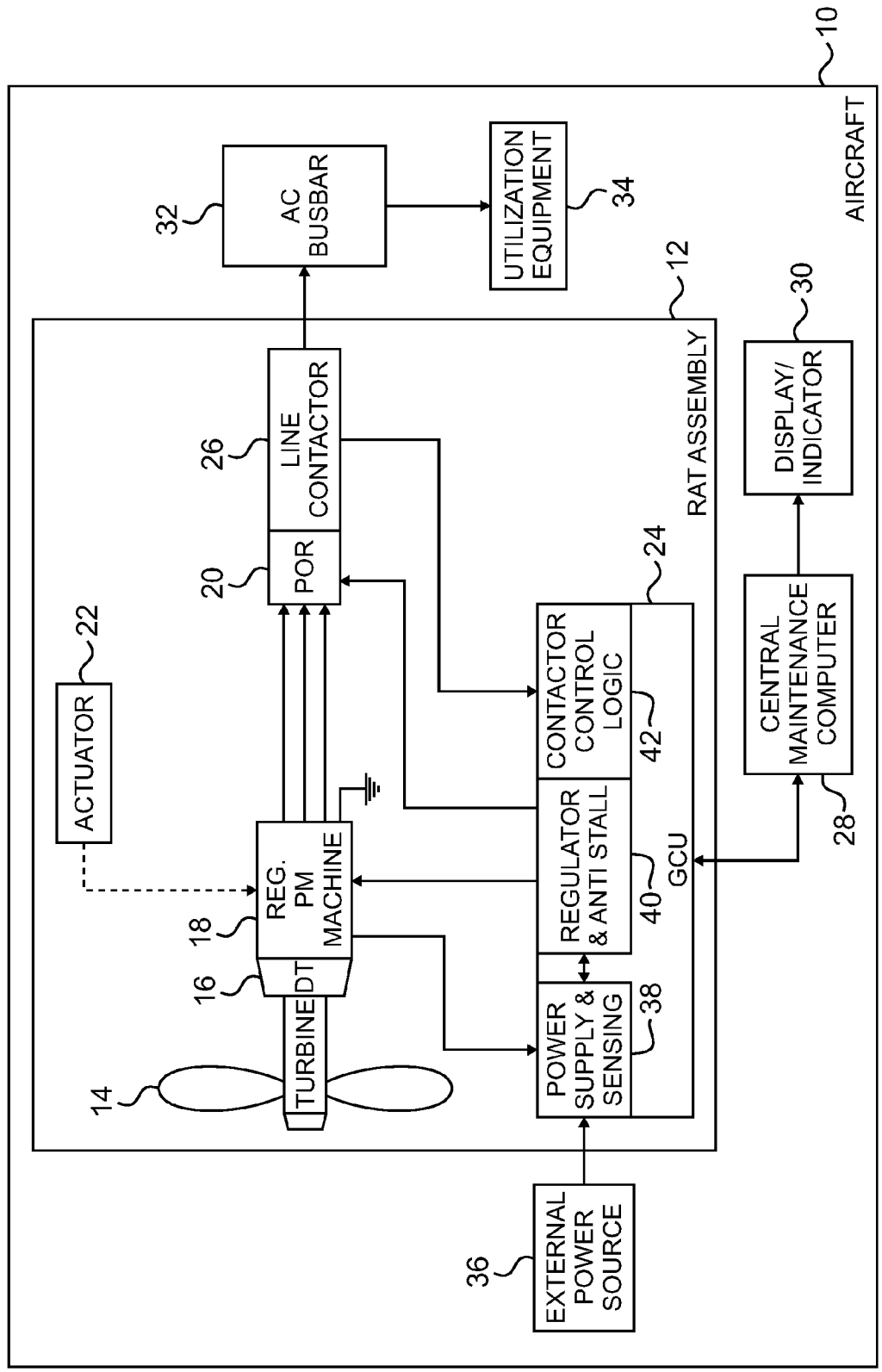
FIG. 1 is a block diagram of an aircraft with a ram air turbine (RAT) assembly according to the present invention.

FIG. 1 is a block diagram of an aircraft 10 with a selectively deployable ram air turbine (RAT) assembly 12. In the illustrated embodiment, the RAT assembly 12 includes a turbine 14, a drivetrain 16, a flux regulated permanent magnet (PM) machine 18, a point of regulation 20, an actuator 22, a generator control unit (GCU) 24, and a line contactor 26. The aircraft 10 can further include a central maintenance computer 28, a display/indicator 30, an AC busbar 32, utilization equipment 34, and an external power source 36. The configurations of the aircraft 10 and RAT assembly 12 are shown in FIG. 1 by way of example and not limitation. Those of ordinary skill in the art will appreciate that other configurations are possible within the spirit and scope of the present invention.

The actuator 22 allows the turbine 14 (as well as other associated components) to be selectively stowed within fuselage of the aircraft 10 or be deployed outside the fuselage. The actuator 22 can be controlled with hydraulics and one or more springs, or have nearly any other configuration as desired for particular applications. The actuator can optionally include an uplock mechanism to prevent unwanted deployment, as well as other known features.

When deployed in flight, the turbine 14 can encounter airflow passing along the aircraft 10. The turbine 14 includes blades (i.e., airfoils) that can rotate in an oncoming airflow. Rotational energy from the turbine can be mechanically transmitted through the drivetrain 16 to other locations. In the illustrated embodiment, the drivetrain 16 is mechanically connected to the flux regulated PM machine 18, and transfers torque from the turbine 14 to the flux regulated PM machine 18. In further embodiments, other components such as a hydraulic pump (not shown) can also be mechanically connected to and powered by the drivetrain 16. It should be noted that the turbine 14 can include speed governing and blade pitch adjustment mechanisms, an anti-rotation hub lock, or other well-known features as desired for particular applications.

The flux regulated PM machine 18 can act as a generator (i.e., a flux regulated PM generator) to generate electrical energy from the torque input from the drivetrain 16. Details of the flux regulated PM machine 18 are discussed below with respect to FIG. 2. The point of regulation 20 allows for regulation of output of the flux regulated PM machine 18, which is sent to the line contactor 26 and then to the AC busbar 32 for use by various equipment carried by the aircraft 10, designated schematically by a box for the utilization equipment 34. The particular equipment of the aircraft 10 powered by electricity from the RAT assembly 12 can vary for particular applications, as will be appreciated by those of ordinary skill in the art.

The RAT GCU 24 provides for control of the operation of the RAT assembly 12. In the illustrated embodiment, the RAT GCU 24 includes circuitry for power supply & sensing 38, regulator & anti-stall 40, and contactor control logic 42 functions. Circuitry of the RAT GCU 24 is operatively connected to the flux regulated PM machine 18, the point of regulation 20 and the line contactor 26. In the illustrated embodiment, the power supply & sensing circuitry 38 and the regulator & anti-stall circuitry 40 are operatively connected to the flux regulated PM machine 18. The regulator & anti-stall circuitry 40 is operatively connected to the point of regulation 20. The contactor control logic 42 is operatively connected to the line contactor 26. Circuitry within the RAT GCU 24 can be operatively linked together as necessary or desired. It should be noted that the particular configuration of the RAT GCU 24 shown in FIG. 1 is provided merely by way of example and not limitation, and other configurations are possible. Additional circuitry not specifically shown can be included in the RAT GCU 24.

The external power source 36 can provide power to the RAT GCU 24, which can in turn selectively distribute power to the flux regulated PM machine 18. The external power source 36 can be an auxiliary power unit (APU), primary generator, or battery carried by the aircraft 10. If the external power source 36 is a battery, it can optionally be carried by the RAT assembly 12 or located elsewhere in the aircraft 10. In an alternative embodiment, the external power source 36 can be located outside the aircraft 10, such as a ground power supply. The external power source 36 can provide power as needed for testing the RAT assembly 12 as described further below. The external power source 36 can provide power to the RAT assembly 12 even when the RAT assembly 12 is in a stowed and non-operational state with the flux regulated PM machine 18 at rest.

The central maintenance computer 28 can be of a known configuration, and can provide data storage and concentration capabilities as well as control of maintenance functions for one or more systems of the aircraft 10. In a typical embodiment, the central maintenance computer 28 can include one or more processors, computer-readable memory and other suitable hardware, as well as suitable software for performing desired maintenance functions. The central maintenance computer 28 can communicate with the RAT GCU 24 as well as other equipment on board or external to the aircraft 10. Maintenance personnel can access the central maintenance computer 28 to control maintenance functions as well as to obtain data stored by the computer 28. In some embodiments, data (e.g., test data from testing of the RAT assembly 12) can be regularly downloaded from the central maintenance computer 28 for review, analysis, storage, etc.

The display/indicator 30 is temporarily or permanently operably connected to the central maintenance computer 28 to provide a display or indication of information from the central maintenance computer 28, such as display of test data gathered from the testing of the RAT assembly 12 or a warning indication triggered by testing conveyed visually, audibly, or in any other suitable format. The display/indicator 30 allows operators, such as maintenance personnel or flight crew, to receive information related to testing of components of the aircraft 10. In one embodiment, the display/indicator can be mounted in a flight deck or cockpit, or alternatively can be provided elsewhere in a location accessible to maintenance personnel. In still further embodiments, the display/indicator 30 can be temporarily connected to the central maintenance computer 28, such as a portable computer or other device that is temporarily linked to the central maintenance computer 28 by maintenance personnel to review test data, and can be located outside the aircraft 10.

Figure 2:
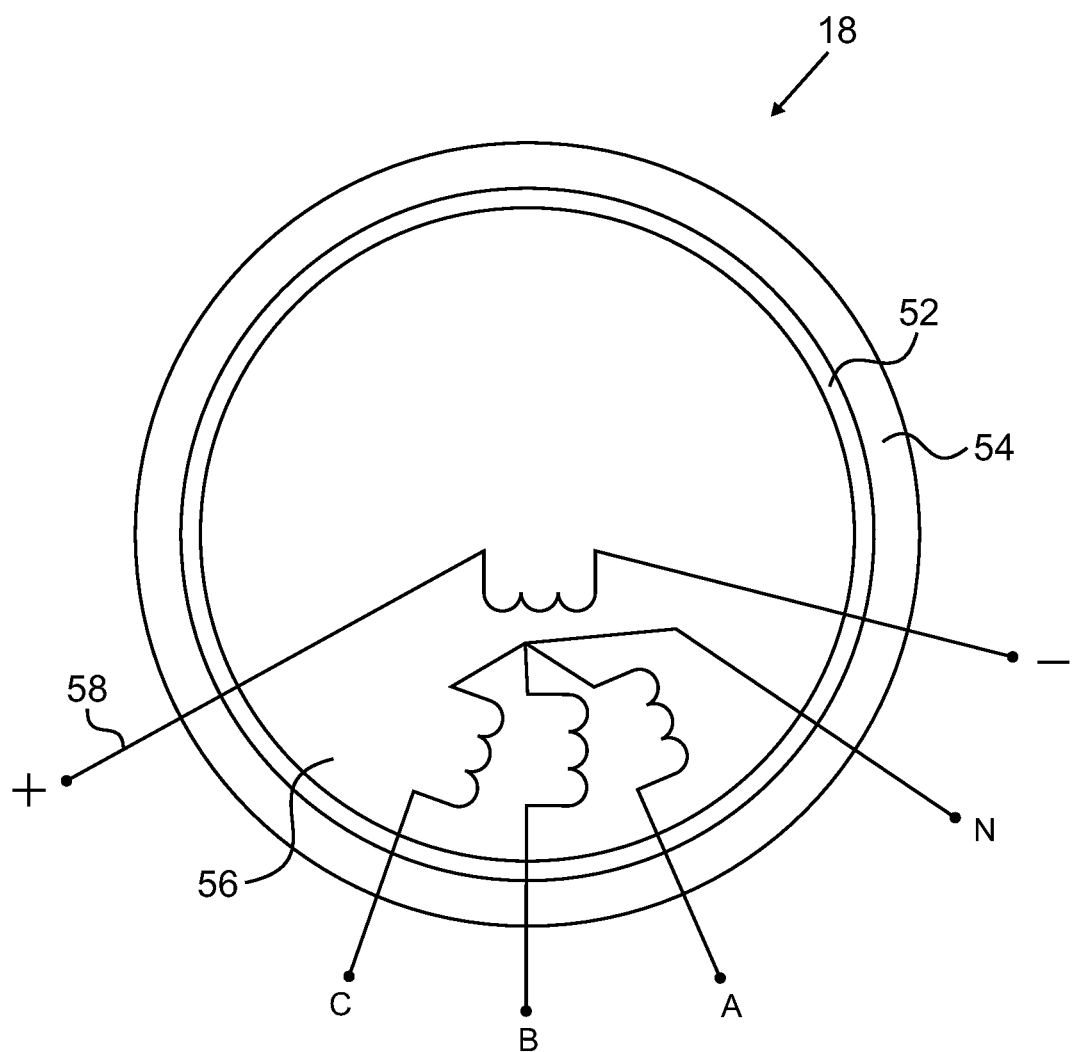
FIG. 2 is an electrical schematic of a flux regulated permanent magnet machine of the RAT assembly.

FIG. 2 is an electrical schematic of one embodiment of the flux regulated PM machine 18 of the RAT assembly 12. In various embodiments, the flux regulated PM machine 18 can have a configuration like that disclosed in commonly-assigned U.S. Pat. Nos. 6,965,183 or 7,777,384, or have another known configuration. In brief, a flux regulated PM machine allows for active electromagnetic regulation of magnetic flux present in the machine to control electrical power generation without dependence upon control of rotational speed of generator components. Those of ordinary skill in the art will appreciate the basic operation of flux regulated PM machines.

As shown in the illustrated embodiment of FIG. 2, the flux regulated PM machine 18 includes permanent magnets 52, a yoke 54, electrical insulation material 56, primary windings A, B, C, and secondary winding 58. A plurality of permanent magnets 52 or alternating polarity would typically be provided, though individual magnets are not specifically shown in FIG. 2 for simplicity. The yoke 54 holds the permanent magnets 52. In a typical embodiment, the permanent magnets 52 and the yoke 54 are part of a rotor subassembly, and the rotor subassembly need not have any windings or rotating diodes for a rectifier. A three-phase output is provided by primary windings A, B and C and neutral connector N. In a typical embodiment the windings A, B, C and connector N are part of a stator subassembly. The secondary winding 58 is provided for regulating the magnetic flux of the permanent magnets 54. The secondary winding 58 can be part of the stator subassembly. The electrical insulator material 56, which can be of any known type, insulates and electrically isolates the various windings in the stator, and is shown merely schematically in FIG. 2. It should be noted that an air gap is present between the stator and rotor subassemblies.

The flux regulated PM machine 18 of the illustrated embodiment does not require any rotating diodes for a rectifier, which simplifies the machine and helps promote reliability and reduce costs. Moreover, the rotor subassembly does not need to include any windings, which facilitates access to the windings and facilitates testing the flux regulated PM machine 18 in a stowed or otherwise non-operational and non-rotating condition.

In further embodiments, the flux regulated PM machine 18 can have other configurations. For example, the flux regulated PM machine 18 can include additional outputs as desired, such as in a three-output configuration.

Figure 3:
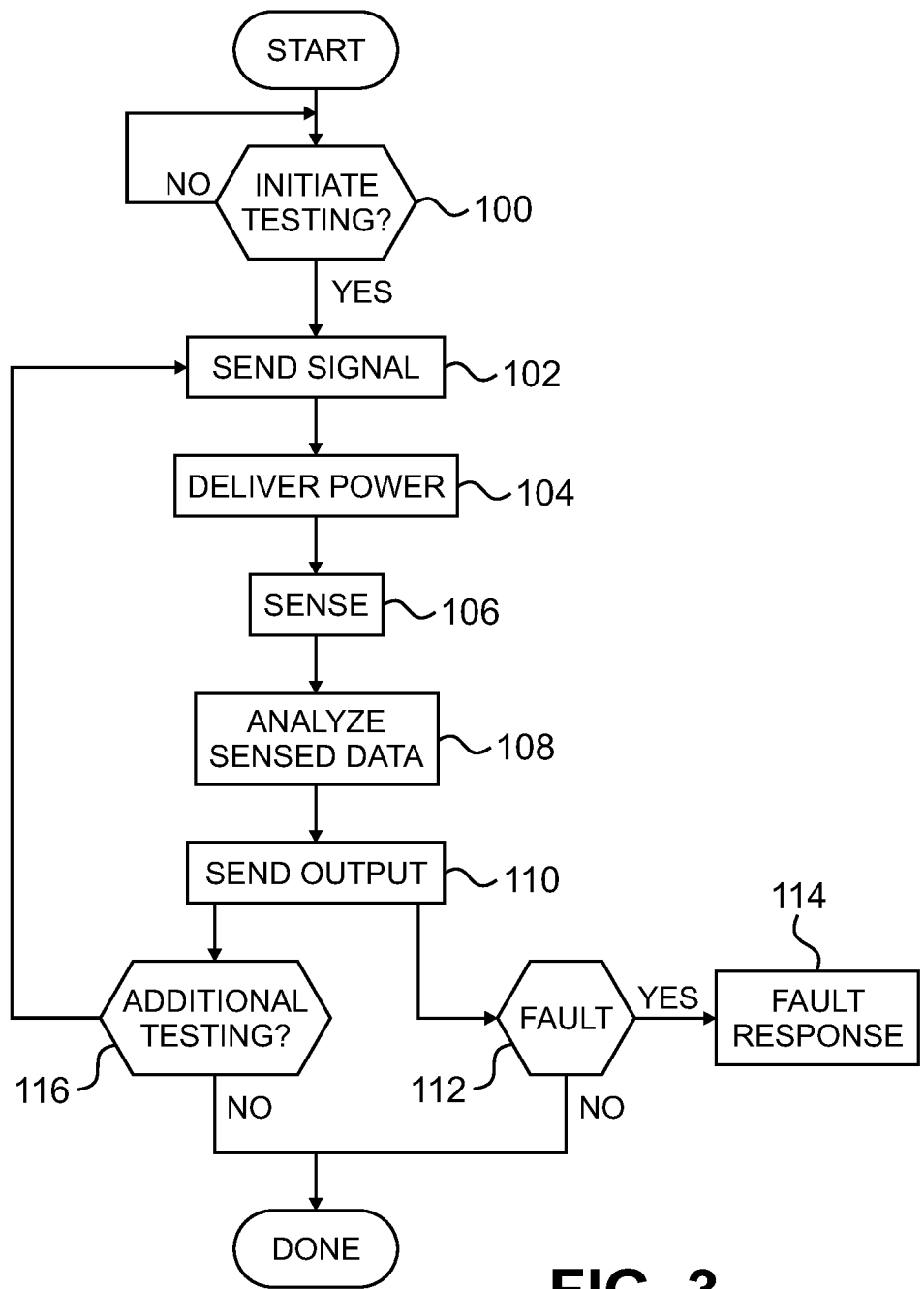
FIG. 3 is a flow chart of a RAT testing method according to the present invention.

FIG. 3 is a flow chart of a RAT testing method. Initially, a decision is made whether or not to initiate testing of the RAT assembly 12 (step 100). A decision to initiate testing can be based on a periodic maintenance schedule, such as testing every 10 minutes before and during a flight, once per week, once per month, once per year, or any other regular recurring schedule, and additionally or in the alternative on an irregular schedule such as once prior to every flight or at arbitrary times when testing is desired. If testing is performed prior to every flight, testing can be triggered as part of pre-flight preparations, for instance. Unlike with prior art RATs, the present method allows for testing to be initiated when the RAT assembly 12 is stowed or otherwise at rest in a non-operational condition without a rotational force input to the turbine 14, drivetrain 16 or flux regulated PM machine 18—though testing could still also be performed in an operational condition as desired. Initiation of testing can be automatically triggered by the central maintenance computer 28 of the aircraft 10 to provide built-in-testing (BIT), or can be manually initiated by an operator. Once the decision is made to initiate testing, a signal can be sent from the central maintenance computer 28 to the RAT GCU 24 to initiate a test protocol for the RAT assembly 12 (step 102).

A test protocol for testing the RAT assembly 12 can include delivering power from the external power source 36 to a selected component (e.g., winding) of the flux regulated PM machine 18 when that machine 18 is at rest, that is, in a non-operational, non-rotating state (step 104), and sensing an electrical parameter while power is supplied (step 106). In one embodiment, the test protocol provides a resistance check of a selected winding of the flux regulated PM machine 18, in which electrical current is passed through the selected winding (e.g., a given phase winding A, B, C or N) and resistance is sensed. Such a resistance check can be performed on individual windings, and can be repeated for all windings as discussed below. In another embodiment, the test protocol provides a dielectric test (also called a grounding check) of the electrical insulation 56 adjacent to a selected winding that includes sensing power leakage between the selected winding and another winding (e.g., between primary and secondary windings) or ground. This allows for detecting undesirable degradation of the electrical insulation material 56 and for electrical shorts from the selected winding to ground. Such a dielectric check can be performed on individual windings/insulation, and can be repeated for all windings as discussed below.

After an electrical parameter is sensed, the sensed data can be analyzed (step 108). Analysis of sensed data from a resistance check or dielectric check can include comparing sensed data from a selected winding or insulation to an absolute limit or threshold. A parameter reaching or exceeding the absolute limit or threshold can indicate the selected winding has failed, shorted or is otherwise in need of maintenance. Alternatively, analysis of sensed data from a resistance check or dielectric check can include performing trend monitoring or using a prognostic algorithm based on sensed data from the selected winding or insulation over time to detect and/or predict failure or other maintenance issues. Trend analysis can reveal sudden or gradual changes in performance that may justify maintenance before a failure occurs. Other types of analysis of sensed data can be performed in alternative embodiments, as desired. Analysis of sensed data can be performed by the RAT GCU 24. Alternatively or in addition, analysis of sensed data can be performed by the central maintenance computer 28, a processor (not shown) external to the aircraft 10, etc.

After analyzing sensed data, an output signal is generated and can be sent to the central maintenance computer 28 from the RAT GCU 24 if analysis is performed by the RAT GCU 24 (step 110). The output signal can result in a display or indication at the display/indicator 30 (see also step 114 below). Alternatively or in addition, the output signal can be stored in a suitable database or other memory of the central maintenance computer 28. The output signal can be generated by or sent to other components depending on the particular configuration of the aircraft 10.

A decision can be made whether the output signal indicates are fault (step 112). Indication of a fault can be of a presently existing fault, or of a likelihood of a future fault or other fault-like maintenance issue. If a fault is indicated, a fault response can be made (step 114). The nature of the fault response will depend upon the particular type of fault as well as other factors. For example, one fault response can simply comprise indication or warning that a fault has occurred, allowing flight crew or maintenance personnel to evaluate the fault. In a typical embodiment, fault response can include implementation of a repair or other maintenance action to correct the fault. Another example of a possible fault response is further testing to isolate or better understand the indicated fault. Other fault responses are possible, as desired for particular situations and applications. Furthermore, even if a fault indication is given that the RAT assembly 12 is inoperable, for a given aircraft and flight plan an operational RAT assembly may not be required and it may be acceptable to merely note the fault and continue flight operations for a given period of time and assess the situation later.

After an output signal is generated, a decision is made as to whether further testing is desired (step 116). If desired, the process can return to step 102 described above. As discussed above, windings of the flux regulated PM machine 18 can be tested individually, meaning that after a first winding is tested further testing on a second winding can then be performed. Furthermore, the availability of different types of testing can allow different types of tests to be performed sequentially, allowing a first type of test (e.g., a resistance check of a first selected winding) to be performed followed by a second type of test (e.g., a dielectric test of the first selected winding). In addition, the decision as to whether additional testing is desired can incorporate an assessment as to whether periodic testing is desired much like that described above with respect to step 100.

Persons of ordinary skill in the art will recognize that the present invention provides numerous advantages and benefits. For example, the use of a flux regulated PM machine in a RAT assembly can help reduce cost and increase reliability. Moreover, the use of a flux regulated PM machine enables testing of a RAT assembly while in a stowed or otherwise non-operational or non-rotating state, which greatly simplifies maintenance, and allows for more frequent testing without the burdensome need to deploy and spin up the RAT assembly for testing. Other advantages and benefits will be appreciated in view of the entire disclosure of the present invention.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For instance, the particular configuration of the generator can vary as desired for particular applications, and a variety of testing procedures can be used as desired for particular applications.

The invention claimed is:

1. A method of testing a deployable ram air turbine having a flux regulated permanent magnet generator, the method comprising:
providing power to a first winding of the flux regulated permanent magnet generator, wherein the power is provided to the first winding when a rotor of the flux regulated permanent magnet generator is at rest;
sensing a resistance of the first winding;
analyzing the sensed resistance of the first winding;
sending an output indicative of test data gathered from the flux regulated permanent magnet generator to a central maintenance computer after analyzing the sensed resistance of the first winding;
performing a dielectric test of electrical insulation adjacent to the first winding, wherein performing the dielectric test comprises sensing power leakage between the first winding and second winding; and
analyzing sensed data from the dielectric test.

2. The method of claim 1 and further comprising:
sending a signal from the central maintenance computer to a generator control unit to initiate testing, wherein the central maintenance computer is located remotely from the deployable ram air turbine.

3. The method of claim 1 and further comprising:
providing power to a second winding of the flux regulated permanent magnet generator, wherein the power is provided to the second winding when a rotor of the flux regulated permanent magnet generator is at rest;
sensing a resistance of the second winding; and
analyzing the sensed resistance of the second winding.

4. The method of claim 3, wherein analyzing the sensed resistance of the second winding comprises comparing sensed resistance of the second winding to a limit.

5. The method of claim 3, wherein analyzing the sensed resistance of the second winding comprises trend monitoring of sensed resistance of the second winding over time.

6. The method of claim 1 and further comprising:

performing a dielectric test of electrical insulation adjacent to the second winding, wherein performing the dielectric test comprises sensing power leakage between the second winding and first winding or ground.

7. The method of claim 1, wherein analyzing the sensed resistance of the first winding comprises comparing sensed resistance of the first winding to a limit.

8. The method of claim 1, wherein analyzing the sensed resistance of the first winding comprises trend monitoring of sensed resistance of the first winding over time.

9. A method of testing a deployable ram air turbine having a flux regulated permanent magnet generator, the method comprising:
provuding power to a first winding of the flux regulated permanent magnet generator, wherein the power is provided to the first winding when a rotor of the flux regulated permanent magnet generator is at rest;
performing a dielectric test of electrical insulation adjacent to the first winding, wherein performing the dielectric test comprises sensing power leakage between the first winding and second winding or ground;
analyzing sensed data from the dielectric test; and
sending an output indicative of test data gathered from the flux regulated permanent magnet generator to a central maintenance computer after performing a dielectric test of electrical insulation adjacent to the first winding.

10. The method of claim 9 and further comprising:
sending a signal from the central maintenance computer to a generator control unit to initiate testing, wherein the central maintenance computer is located remotely from the deployable ram air turbine.

11. The method of claim 9 and further comprising:
sensing a resistance of the first winding; and
analyzing the sensed resistance of the first winding.

12. The method of claim 11, wherein analyzing the sensed resistance of the first winding comprises comparing sensed resistance of the first winding to a limit.

13. The method of claim 11, wherein analyzing the sensed resistance of the first winding comprises trend monitoring of sensed resistance of the first winding over time.

14. The method of claim 9 and further comprising:
providing power to a second winding of the flux regulated permanent magnet generator, wherein the power is provided to the second winding when a rotor of the flux regulated permanent magnet generator is at rest;
sensing a resistance of the second winding; and
analyzing the sensed resistance of the second winding.

15. The method of claim 14, wherein analyzing the sensed resistance of the second winding comprises comparing sensed resistance of the second winding to a limit.

16. The method of claim 14, wherein analyzing the sensed resistance of the second winding comprises trend monitoring of sensed resistance of the second winding over time.

17. The method of claim 9 and further comprising:
performing a dielectric test of electrical insulation adjacent to the second winding, wherein performing the dielectric test comprises sensing power leakage between the second winding and first winding.

18. A deployable ram air turbine assembly comprising:
a rotatable turbine;
an actuator for selectively deploying the rotatable turbine;
a drivetrain mechanically connected to the rotatable turbine;
a flux regulated permanent magnet generator operably connected to the drivetrain; and
a generator control unit, wherein the generator control unit is configured to run a test protocol on the flux regulated permanent magnet generator, wherein the test protocol provides a dielectric test of electrical insulation adjacent to the first winding, wherein performing the dielectric test comprises sensing power leakage between the first winding and second winding or ground.

19. The assembly of claim 18 wherein at least one electrical component of the flux regulated permanent magnet generator is configured to receive power from an external power source to perform the test protocol.

20. The assembly of claim 18, wherein the generator control unit is further configured to send test data to a central maintenance computer to store the test data.

* * * * *